(12) United States Patent
Weyers et al.

(10) Patent No.: US 9,401,355 B2
(45) Date of Patent: Jul. 26, 2016

(54) SEMICONDUCTOR DEVICE INCLUDING A DIODE ARRANGED IN A TRENCH

(75) Inventors: Joachim Weyers, Hoehenkirchen (DE); Anton Mauder, Kolbermoor (DE); Franz Hirler, Isen (DE); Andreas Meiser, Sauerlach (DE); Ulrich Glaser, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/328,371

(22) Filed: Dec. 16, 2011

(65) Prior Publication Data

US 2013/0153916 A1    Jun. 20, 2013

(51) Int. Cl.
| | |
|---|---|
| *H01L 29/66* | (2006.01) |
| *H01L 29/02* | (2006.01) |
| *H01L 23/62* | (2006.01) |
| *H01L 27/06* | (2006.01) |
| *H01L 29/861* | (2006.01) |
| *H01L 27/08* | (2006.01) |
| *H01L 27/02* | (2006.01) |

(52) U.S. Cl.
CPC ............ *H01L 27/06* (2013.01); *H01L 27/0255* (2013.01); *H01L 27/0814* (2013.01); *H01L 29/861* (2013.01); *H01L 29/8611* (2013.01)

(58) Field of Classification Search
USPC ................... 257/173, 175, 328, 355, 356
See application file for complete search history.

(56) References Cited

U.S. PATENT DOCUMENTS

| 5,917,228 A | 6/1999 | Matsuda et al. | |
|---|---|---|---|
| 6,027,956 A * | 2/2000 | Irissou | 438/68 |
| 6,191,466 B1 * | 2/2001 | Yamashita et al. | 257/481 |
| 6,198,136 B1 * | 3/2001 | Voldman et al. | 257/357 |
| 6,538,299 B1 * | 3/2003 | Kwark et al. | 257/458 |
| 6,943,409 B1 * | 9/2005 | Cheng et al. | 257/330 |
| 7,829,972 B2 | 11/2010 | Hirler et al. | |
| 8,836,072 B2 | 9/2014 | Qu et al. | |
| 2003/0205762 A1 * | 11/2003 | Robb et al. | 257/355 |
| 2005/0151200 A1 * | 7/2005 | Chen | 257/355 |

(Continued)

FOREIGN PATENT DOCUMENTS

| CN | 1537333 A | 10/2004 |
|---|---|---|
| DE | 102004059640 A1 | 6/2006 |

(Continued)

OTHER PUBLICATIONS

Arienzo, M. et al. "In Situ Arsenic-Doped Polysilicon for VLSI Applications." IEEE Transactions on Electron Devices, vol. 33, Issue 10, Oct. 1986.

(Continued)

*Primary Examiner* — Mohammad Islam
*Assistant Examiner* — Jay C Chang
(74) *Attorney, Agent, or Firm* — Murphy, Bilak & Homiller, PLLC

(57) ABSTRACT

One embodiment of an integrated circuit includes a semiconductor body. In the semiconductor body a first trench region extends into the semiconductor body from a first surface. The integrated circuit further includes a diode including an anode region and a cathode region. One of the anode region and the cathode region is at least partly arranged in the first trench region. The other one of the anode region and the cathode region includes a first semiconductor region adjoining the one of the anode region and the cathode region from outside of the first trench region.

29 Claims, 11 Drawing Sheets

(56) References Cited

U.S. PATENT DOCUMENTS

| | | | | |
|---|---|---|---|---|
| 2006/0186421 | A1* | 8/2006 | Shim et al. | 257/94 |
| 2006/0214221 | A1* | 9/2006 | Challa et al. | 257/328 |
| 2007/0158678 | A1* | 7/2007 | Udrea | H01L 29/0834 257/119 |
| 2008/0135872 | A1 | 6/2008 | Chen et al. | |
| 2010/0052100 | A1* | 3/2010 | Barth et al. | 257/538 |
| 2012/0261804 | A1* | 10/2012 | Li et al. | 257/653 |

FOREIGN PATENT DOCUMENTS

| | | |
|---|---|---|
| DE | 102006029682 A1 | 1/2007 |
| DE | 102006011567 A1 | 9/2007 |
| DE | 102009028252 A1 | 2/2011 |
| EP | 1353368 A1 | 10/2003 |
| JP | 2000299477 A | 10/2000 |

OTHER PUBLICATIONS

Arienzo, M. et al. "LPCVD In-Situ Arsenic Doped Polysilicon for VLSI Applications." 1985 International Electron Devices Meeting, 1985, pp. 220-223.

Umemoto, M. et al. "High-Performance Vertical Interconnection for High-Density 3D Chip Stacking Package." Proceedings of the 54th Electronic Components and Technology Conference, vol. 1, Jun. 1-4, 2004.

* cited by examiner

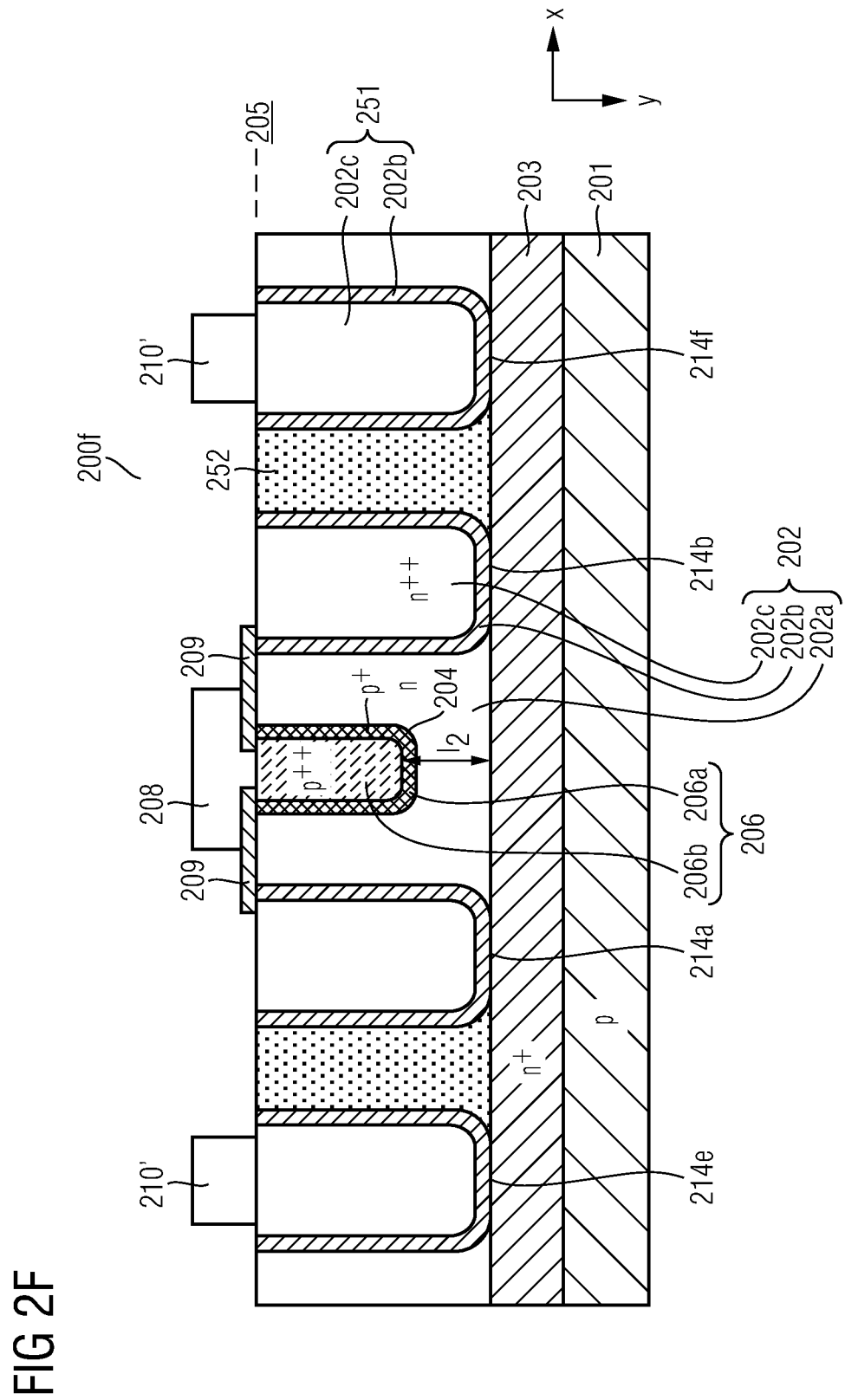

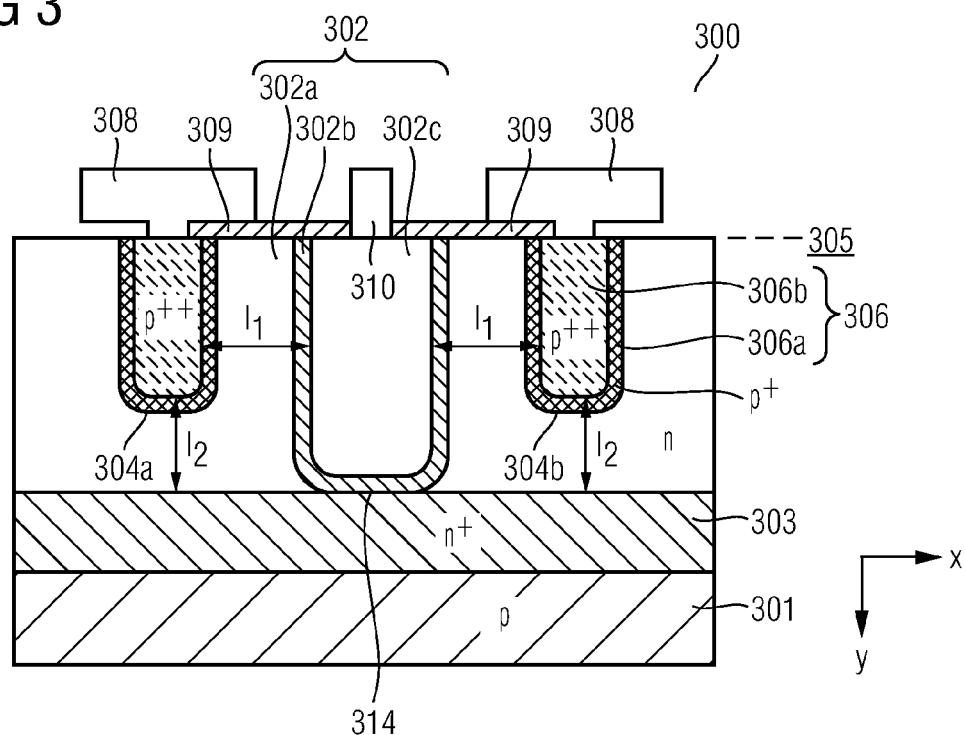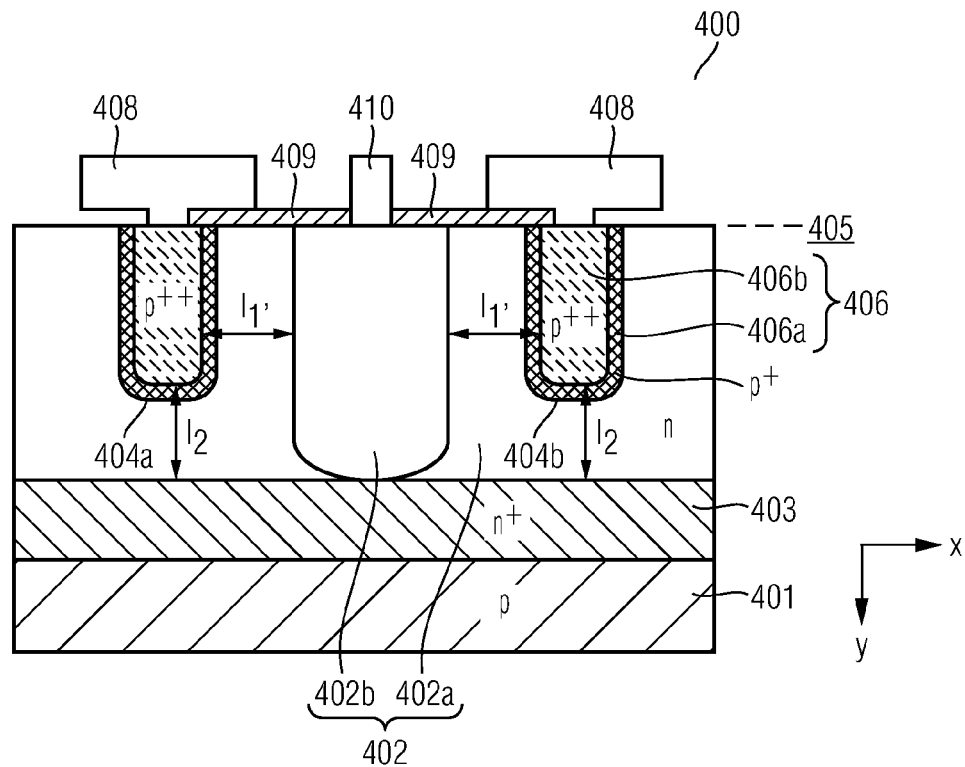

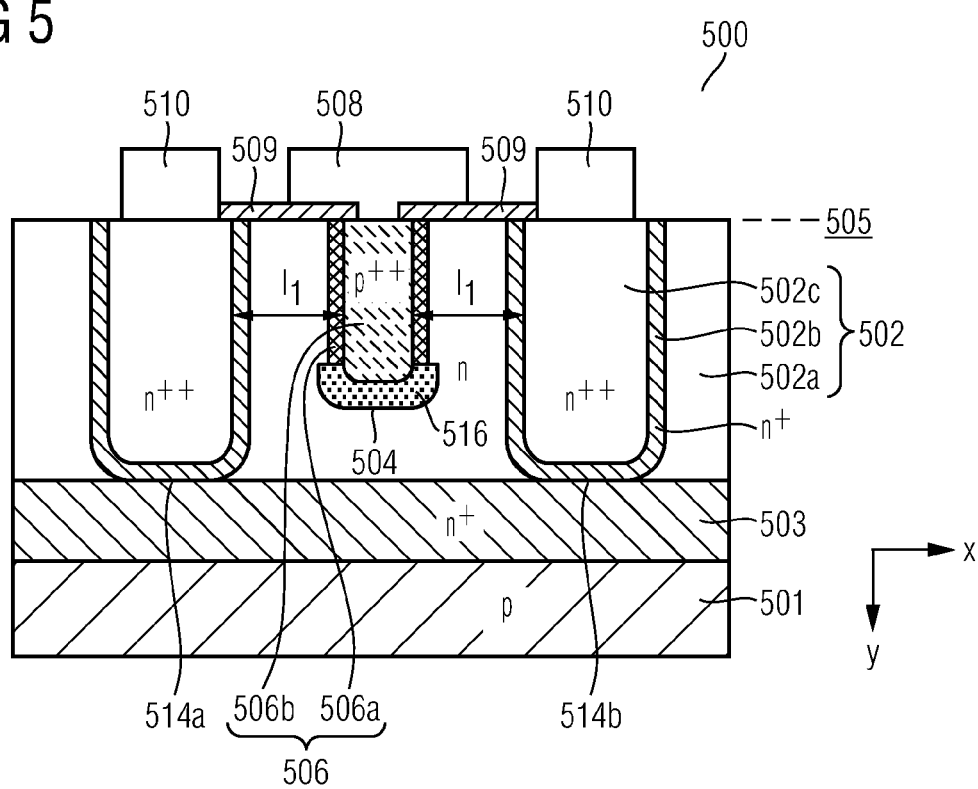
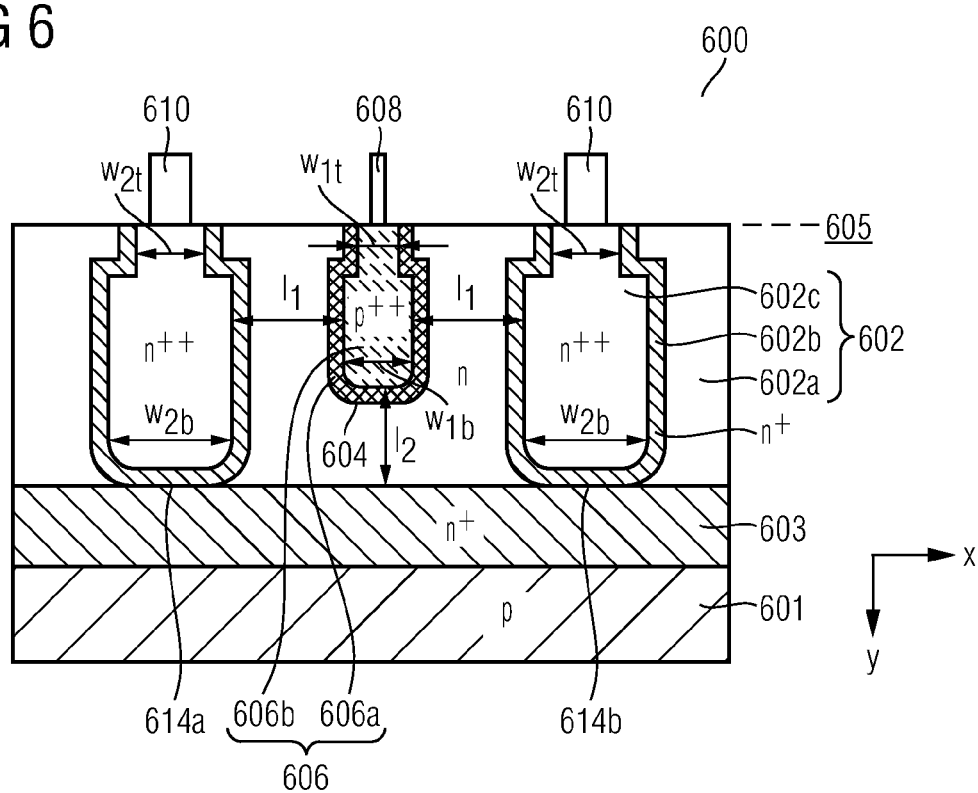

SEMICONDUCTOR DEVICE INCLUDING A DIODE ARRANGED IN A TRENCH

BACKGROUND

In integrated circuits protection of circuit blocks including interconnected elements such as resistors, capacitors and transistors protection measures against electrostatic discharge aim at eliminating destruction of functional elements of the circuit blocks of the integrated circuit by the electrostatic discharge.

Since dimensions of semiconductor devices tend to shrink with advancing semiconductor technologies while demands on functionality such as current carrying capability or ESD robustness of diodes remain unaffected, shrinking dimensions of diodes while maintaining their level of functionality is challenging.

Thus, it is desirable to shrink dimensions of diodes while maintaining their level of functionality such as current carrying capability or robustness against electrostatic discharge.

SUMMARY

According to one embodiment of a semiconductor device, the semiconductor device includes a semiconductor body including a first trench region extending into the semiconductor body from a first surface. The semiconductor device further includes a diode including an anode region and a cathode region. One of the anode region and the cathode region is at least partly arranged in the first trench region. The other one of the anode region and the cathode region includes a first semiconductor region adjoining the one of the anode region and the cathode region from the outside of the first trench region.

Those skilled in the art will recognize additional features and advantages upon reading the following detailed description, and on viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

FIGS. 2A to 2F are schematic illustrations of vertical cross sections through embodiments of a part of diodes including a p-doped anode region in a first trench and n-doped cathode regions in second trenches.

FIG. 3 is a schematic illustration of a vertical cross section through a part of a diode including p-doped anode regions in first trenches and an n-doped cathode region in a second trench.

FIG. 4 is a schematic illustration of a vertical cross section through a part of a semiconductor diode including p-doped anode regions in first trenches and an $n^{++}$-doped sinker between the first trenches.

FIG. 5 is a schematic illustration of a vertical cross section through a part of a diode including a p-doped semiconductor region in a first trench and an insulating layer at a bottom side of the first trench.

FIG. 6 is a schematic illustration of a vertical cross section through a part of a diode including anode and cathode regions within first and second trenches having a lateral width that is larger in a bottom part of each of the trenches than in a top part.

DETAILED DESCRIPTION

Figure 1:
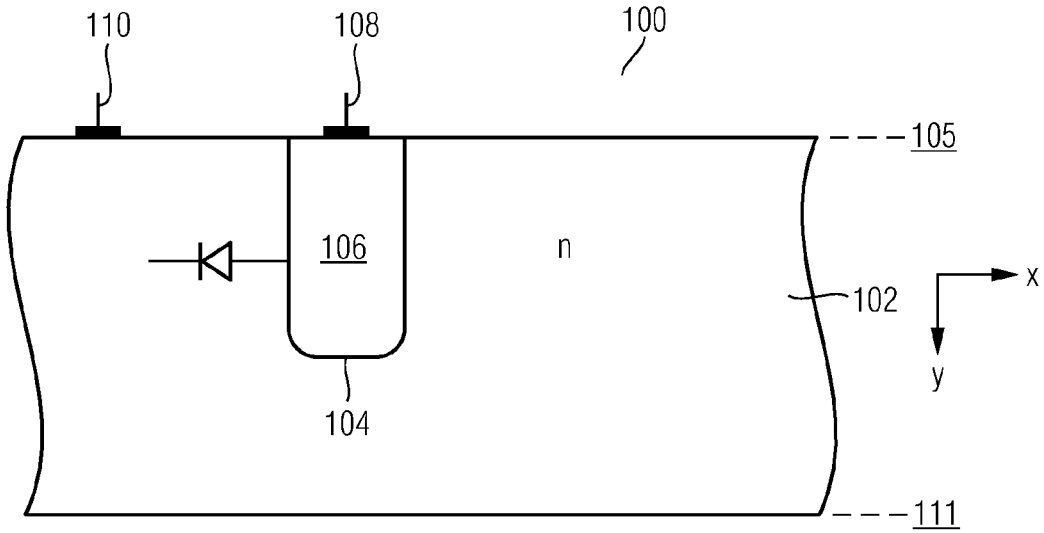
FIG. 1 is a schematic illustration of a vertical cross section through a part of a semiconductor diode including an anode region within a trench.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together intervening elements may be provided between the "coupled" or "electrically coupled" elements. The term "electrically connected" intends to de-scribe a low-ohmic electric connection between the elements electrically connected together, e.g. a connection via a metal and/or highly doped semiconductor.

In this specification, n-doped may refer to a first conductivity type while p-doped is referred to a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "−−" or "+" or "++" next to the doping type. For example, "n−" means a doping concentration which is less than the doping concentration of an "n"-doping region while an "n+"-doping region has a larger doping concentration than the "n"-doping region. Indicating the relative doping concentration does not, however, mean that doping regions of the same relative doping concentration have the same absolute doping concentration unless otherwise stated. For example, two different n+-doped regions can have different absolute doping concentrations. The same applies, for example, to an n+-doped and a p+-doped region.

In the context of the present specification, the term "field-effect structure" intends to describe a structure which is formed in a semiconductor substrate or semiconductor body or semiconductor device and has a gate electrode which is insulated at least from the body region by a dielectric region or dielectric layer. Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$) or stacks of these materials.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIG. 1 illustrates a vertical cross section through a part of a semiconductor diode 100.

In an n-doped cathode region 102, e.g. an n-doped epitaxial layer, a first trench 104 is formed and extends from a first surface 105 into the n-doped cathode region 102. An anode region 106 is at least partly arranged in the first trench 104. The anode region may include a p-doped semiconductor layer and/or one or a plurality of metal layers. According to one embodiment, the anode region includes a p-doped semiconductor layer and p-type impurities of the p-doped semiconductor layer extend into the n-doped cathode region 102 (not illustrated in FIG. 1). This may be caused by diffusion of the p-type impurities from a source in or at sidewalls of the first trench 104 into the n-doped cathode region 102. A diffusion profile of the p-type impurities may depend on a thermal budget during manufacture of the diode. Thereby, a pn junction may be shifted from a sidewall of the first trench 104 into the n-doped cathode region 102 and the anode region extends from a sidewall of the first trench 104 into the n-doped cathode region 102.

The diode 100 may be a pn junction diode if the n-doped cathode region 102 adjoins a p-doped semiconductor layer that is at least partly arranged in and/or at a sidewall of the first trench 104 and may also extend into the semiconductor area surrounding the first trench 104 due to diffusion of p-type impurities into the n-doped cathode region 102 via a sidewall of the first trench 104. The diode 100 may also be a Schottky diode in case the n-doped cathode region 102 adjoins a Schottky contact metal in or at a sidewall of the first trench 104.

As an example, the anode region 106 may be electrically connected to an anode contact 108 at the first surface 105. Also the n-doped cathode region 102 may be electrically connected to a cathode contact 110 also at the first surface 105. According to another embodiment, the cathode contact 110 may be provided at a second surface 111 of the cathode region 102 opposite the first surface 105.

According to an embodiment, the diode 100 is an ESD (electrostatic discharge) protection device. The diode 100 may cover an area at the first surface 105 in a range between 1000 $\mu m^2$ and 1 $mm^2$. Such an area allows the ESD protection device to withstand, i.e. dissipate the energy of, at least 2 kV discharge pulses according to the so-called Human Body Model (HBM). According to another embodiment, the diode 100 is a clamping diode configured to clamp a voltage between two terminals of a semiconductor device such as the drain and source of an FET (field effect transistor) switch to a certain value or range of values. The clamping diode may cover an area at the first surface 105 in a range between 1000 $\mu m^2$ and 10 $mm^2$, for example. A differential resistance as well as a current per area used herein relate to an area of the diode 100 at the first surface 105. Contact pads and edge termination structures outside of an active area of the diode 100 do not contribute to the area as used above, i.e. do not contribute to the calculation of the differential resistance or the current per area.

According to an embodiment, a depth of the first trench 104 is at least 1 $\mu m$. An aspect ratio of the first trench 104 is at least 1.

According to an embodiment, one of the anode region 106 and the cathode region 102 is electrically connected to a pin, e.g. a power supply pin, an input/output pin or a ground (GND) pin. The electrical connection between the one of the anode region 106 and the cathode region 102 and the respective pin is low-ohmic and may include one or more conductive lines such as metal lines and their interconnection but no intervening elements such as resistors. Such a low-ohmic electrical connection may also apply to each one of the anode region 106 and the cathode region 102. In this case, the regions 102, 108 are electrically connected to different pins.

Adjustment of the doping profile within the first trench 104 and n-doped cathode region 102 as well as the trench width and trench bottom profile allow avoiding electrical breakdown at a corner at the bottom of the trench 104.

According to an embodiment, more than 50% of an electrical breakdown current between the anode region 106 and the cathode region 102 flows via a sidewall of the first trench 104. This parameter as well as a current-carrying area of the diode 100 can be further increased by increasing a depth of the first trench 104, for example. Further, due to the arrangement of the anode region 106 in the trench 104, a path resistance between the anode contact 108 and the junction between the anode region 106 and the cathode region 102 can be decreased by increasing an electrical conductivity of a material filled in the trench 106. This allows to reduce a path resistance between anode and cathode in a breakdown mode of the diode 100 compared to a diode structure having an electrical breakdown between anode and cathode along a vertical direction y, for example.

Figure 2A:
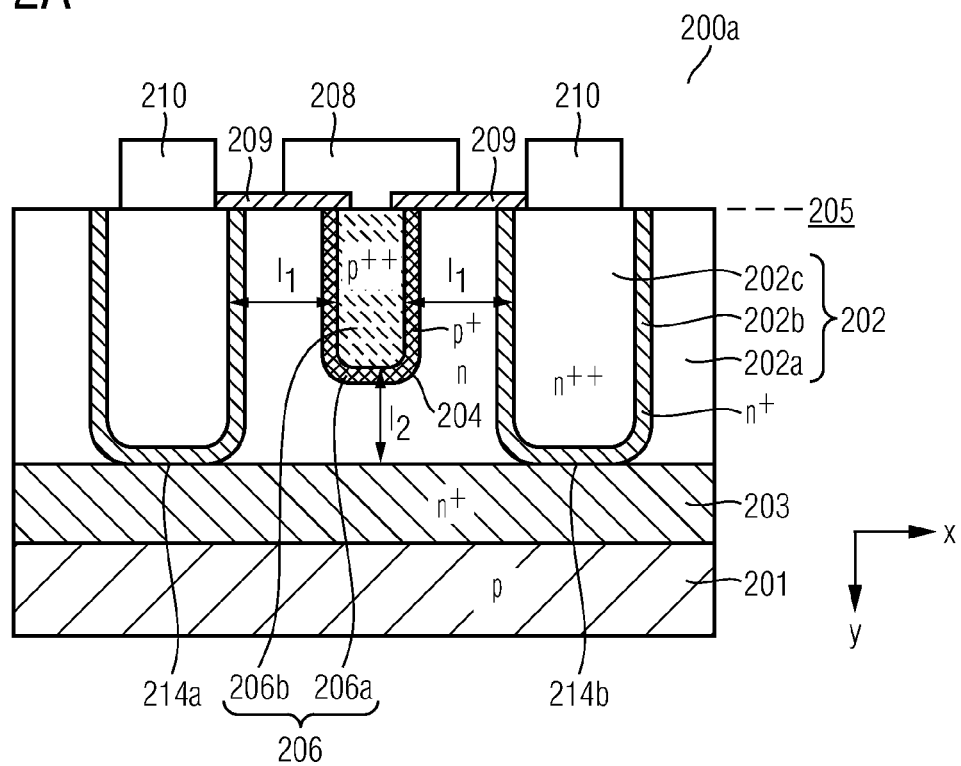

FIG. 2A is a schematic illustration of a vertical cross section through a part of a diode 200a according to an embodiment.

The diode 200a includes a p-doped semiconductor substrate 201, e.g. a p-doped silicon (Si) substrate. The diode 200a further includes a first n-doped layer 202, e.g. an epitaxial n-doped layer, on the p+-doped semiconductor substrate 201 and an n+-doped buried layer 203 arranged between the first n-doped layer 202 and the p-doped semiconductor substrate 201.

A first trench 204 extends from a first surface 205 into the first n-doped layer 202. The first trench 204 ends within the first n-doped layer 202 leaving a vertical distance $l_2$ to a top side of the n+-doped buried layer 203. A first p+-doped semiconductor layer 206a adjoins or extends through sidewalls and a bottom side of the first trench 204. As an example, the first p+-doped semiconductor layer 206a may be formed by diffusing p-type impurities into the first n-doped layer 202 via the sidewalls and the bottom side of the first trench 204, for example.

The first trench 204 is filled with a second p++-doped semiconductor layer 206b such as p++-doped polysilicon, for example. An anode contact 208, e.g. a metal or metal alloy layer or layer stack is electrically connected to the second p++-doped semiconductor layer 206b at the first surface 205. The anode contact 208 laterally extends into an area above the first n-doped layer 202 and thus acts as a field plate configured to suppress an electrical breakdown between the first p+-doped layer 206a and the first n-doped layer 202 at the first surface 205. An insulating layer 209 is arranged between the anode contact 208 and the first n-doped semiconductor layer 202a. According to another embodiment, the field plate may also be formed by a polysilicon layer. Furthermore, an oxide step or taper may be deposited including oxides such as gate oxide, field oxide, LOCOS (Local Oxidation of Silicon) and STI (Shallow Trench Isolation).

Second trenches 214a, 214b extend from the first surface 205 through the first n-doped layer 202a to the n+-doped buried layer 203. Each one of the second trenches 214a, 214b has a lateral distance $l_1$ to the first trench 204. In each one of the second trenches 214a, 214b, a second n+-doped layer 202b adjoins or extends through sidewalls and a bottom side of the corresponding one of the second trenches 214a, 214b. As an example, the second n+-doped semiconductor layer 202b may be formed by diffusing n-type impurities into the first n-doped layer 202a via the sidewalls and the bottom side of the second trenches 214a, 214b, for example.

Each one of the second trenches 214a, 214b is filled with a third n++-doped semiconductor layer 202c such as n++-doped polysilicon, for example. As an alternative to the n++-doped semiconductor layer 202c, a metal, a metal alloy or a silicide may be used. A cathode contact 210, e.g. a metal or metal alloy layer or layer stack is electrically connected to the third n++-doped semiconductor layer 202c at the first surface 205.

An anode region 206 includes the first p+-doped layer 206a and the second p++-doped semiconductor layer 206b. A cathode region 202 includes the first n-doped semiconductor layer 202a, the second n+-doped layer 202b and the third n++-doped semiconductor layer 202c.

A lateral breakdown voltage $V_{br,l}$ between the anode region 206 and the cathode region 202 may be adjusted by the lateral distance $l_1$. As an example, when increasing (decreasing) $l_1$ the lateral breakdown voltage $V_{br,l}$ may be increased (decreased).

Current flow during electrical breakdown between the anode region 206 and the cathode region 202 may also be supported by a vertical breakdown current flowing at a bottom side of the first trench 204. A vertical breakdown voltage $V_{br,v}$ may be set larger than $V_{br,l}$ by setting $l_2$ relative to $l_1$, e.g. $l_2 > l_1$. The electrical field at a bottom edge of the first trench 204 can be reduced by diffusion of p-type impurities of the first p+-doped layer 206a into the surrounding semiconductor region and optimization of the doping concentrations of the first n-doped semiconductor layer 202a, the second n+-doped semiconductor layer 202b, the third n++-doped semiconductor layer 202c, the first p+-doped layer 206a, the second p++-doped semiconductor layer 206b and the field plates 208, 209.

According to an embodiment, the diode 200a is an ESD protection device. The diode 200a may cover an area at the first surface 205 in a range between 1000 µm² and 1 mm². Such an area allows the ESD protection device to withstand, i.e. dissipate the energy of, at least 2 kV discharge pulses according to the so-called Human Body Model (HBM). According to another embodiment, the diode 200a is a clamping diode configured to clamp a voltage between two terminals of a semiconductor device such as drain and source of a FET switch to a certain value or range of values. The clamping diode may cover an area at the first surface 205 in a range between 1000 µm² and 10 mm², for example.

According to an embodiment, a width of each one of the first and second trenches 204 and 214a, 214b at the first surface 205 is smaller than a depth of the respective one of the first and second trenches 204 and 214a, 214b.

Since a direction of electrical breakdown current between the anode region 206 and the cathode region 202 includes a lateral component parallel to the first surface 205, a current-carrying area of the diode 200a can be increased by increasing a depth of the first and second trench 204 and 214a, 214b, for example. Further, due to the arrangement of the anode region 206 in the first trench 204, a path resistance between the anode contact 208 and the junction between the anode region 206 and the cathode region 202 can be decreased by increasing an electrical conductivity of a material filled in the first trench 204. This allows to reduce a path resistance between anode and cathode in a breakdown mode of the diode 200a compared to a diode structure having an electrical breakdown between anode and cathode along a vertical direction perpendicular to the first surface 205, for example. A resistance for a constant breakdown voltage may be minimized by an optimization of diode pitch, trench depths and doping areas, for example.

Embodiments of diodes described herein allow to reduce a differential resistance of an electrical breakdown current. This results in an improved voltage clamping of a voltage clamping diode or during electrostatic discharge via an ESD diode.

Figure 2B:
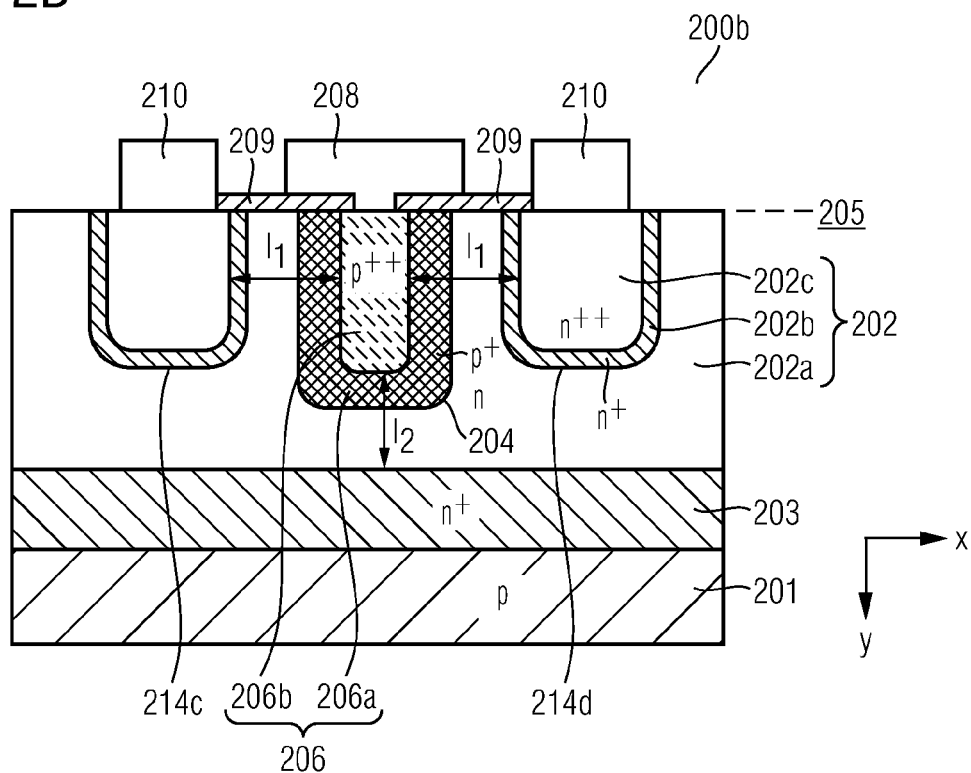
Figure 2C:
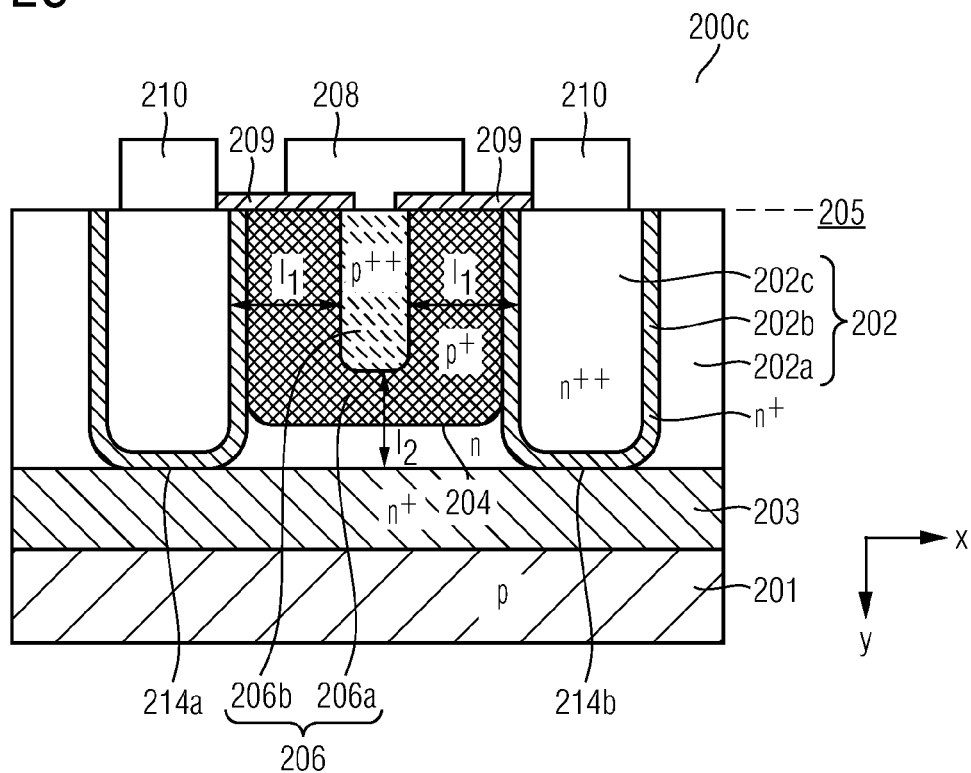

The diodes 200b, 200c illustrated in FIGS. 2B and 2C differ from the diode 200a illustrated in FIG. 2A with regard to a lateral extension of the first p+-doped layer 206a. In both the diode 200b and the diode 200c the first p+-doped layer 206a has a lateral dimension that is larger than in the diode 200a illustrated in FIG. 2A. Manufacturing of the diodes 200a, 200b and 200c may include local epitaxy, local implantation and diffusion, deposition of an impurity source and diffusion of impurities out of the impurity source into a surrounding semiconductor region.

Further, a depth of the second trenches 214c, 214d of the diode 200b is smaller than the depth of the first trench 204.

A spacing between the first and second trenches 204, 214a . . . 214d may be reduced as much as electric field strength between anode and cathode trench is substantially larger in a horizontal direction, e.g. parallel to the first surface 205 than in a vertical direction perpendicular to the first surface 205.

Figure 2D:
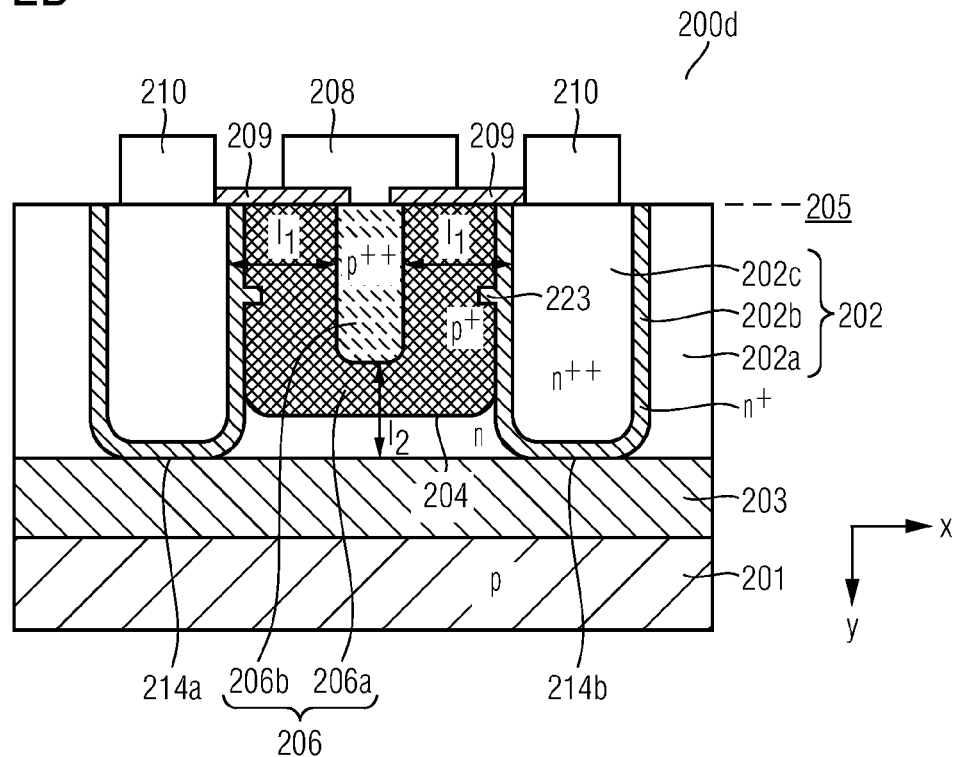

FIG. 2D illustrates a diode 200d according to another embodiment. The diode 200d is similar to diode 200c illustrated in FIG. 2C, but further includes a p+-doped breakdown zone 223. The breakdown zone 223 may be formed by buried implantation or by a diffusion zone and may be arranged in a range of 20% to 80% of a depth of one of the first trench 204, the second trenches 214a, 214b, first p$^+$-doped layer 206a. The breakdown zone 223 if configured to initiate electrical breakdown between anode and cathode. After ignition of electrical breakdown with increasing current, the effective area of breakdown current will be increased successively.

Figure 2E:
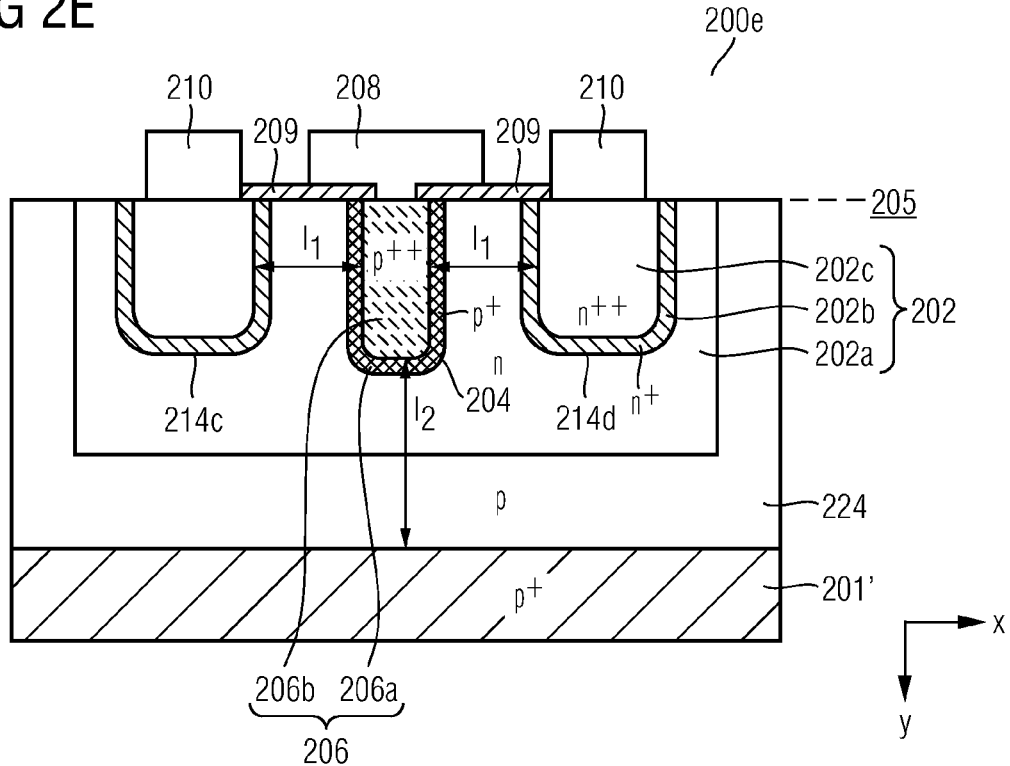

FIG. 2E illustrates a diode 200e according to another embodiment. The diode 200e is similar to diode 200b illustrated in FIG. 2B regarding the arrangement of anode and cathode, but differs from the diode 200b by absence of the n$^+$-doped buried layer 203. In more detail, instead of the p-doped semiconductor substrate 201 and the n$^+$-doped buried layer 203 illustrated in FIG. 2B, the diode 200e includes a p$^+$-doped semiconductor substrate 201' and a p-doped semiconductor layer 224 such as a p-doped epitaxial layer thereon. The p-doped semiconductor layer 224 adjoins the first surface 205 and includes the first n-doped semiconductor layer 202a formed therein. The first n-doped semiconductor layer 202a may be an n-doped semiconductor well embedded in the p-doped semiconductor layer 224, for example.

FIG. 2F illustrates a diode 200f according to another embodiment. Compared with diode 200a illustrated in FIG. 2A, the diode 200f lacks a cathode contact on the third n$^{++}$-doped semiconductor layer 202c. The third n$^{++}$-doped semiconductor layer 202c may be floating, for example. A cathode contact 210' is arranged on a conductive material 251 arranged in a third trench 214f (214e). The second trench 214b (214a) is arranged between the first trench 204 and the third trench 214f (214e). As an example, the conductive material 251 may include the second n$^+$-doped layer 202b and the third n$^{++}$-doped semiconductor layer 202c. A material 252 arranged between the third trench 214f and the second trench 214b includes a specific resistance that is substantially larger, e.g. a factor of 10, or 100 or 1000 than the specific resistance of the third n$^{++}$-doped semiconductor layer 202c. Since an electrical breakdown current flows via the second trench 214b, the buried layer 203 and the third trench 214f into the cathode contact 210', spreading of a breakdown current along a sidewall of the first trench 204 can be homogenized.

FIG. 3 is a schematic illustration of a vertical cross section through a part of a diode 300 according to an embodiment.

Similar to the diode 200a illustrated in FIG. 2A, the diode 300 includes a p-doped semiconductor substrate 301, a cathode region 302, a first n-doped layer 302a, a second n$^+$-doped layer 302b, a third n$^{++}$-doped layer 302c, an n$^+$-doped buried layer 303, first trenches 304a, 304b, a first surface 305, an anode region 306, a first p$^+$-doped semiconductor layer 306a, a second p$^{++}$-doped semiconductor layer 306b, an anode contact 308 acting as a field plate, an insulating layer 309, a cathode contact 310, a second trench 314, a lateral distance l$_1$ between the each one of the first trenches 304a, 304b and the second trench 314 and a vertical distance l$_2$ between a bottom side of each one of the first trenches 304a, 304b to a top side of the n$^+$-doped buried layer 303.

The diode 300 differs from the diode 200a of FIG. 2A with regard to the arrangement of the first and second trenches. In the embodiment illustrated in FIG. 3, the second trench 314 is arranged between first trenches 304a, 304b, whereas in the embodiment illustrated in FIG. 2A, the first trench 204 is arranged between the second trenches 214a, 214b.

FIG. 4 is a schematic illustration of a vertical cross section through a part of a diode 400 according to an embodiment.

Similar to the diode 300 illustrated in FIG. 3, the diode 400 includes a p-doped semiconductor substrate 401, a cathode region 402, a first n-doped layer 402a, an n$^+$-doped buried layer 403, first trenches 404a, 404b, a first surface 405, an anode region 406, a first p$^+$-doped semiconductor layer 406a, a second p$^{++}$-doped semiconductor layer 406b, an anode contact 408 acting as a field plate, an insulating layer 409, a cathode contact 410, a vertical distance l$_2$ between a bottom side of each one of the first trenches 404a, 404b to a top side of the n$^+$-doped buried layer 403.

The diode 400 differs from the diode 300 of FIG. 3 with regard to the cathode region. In the embodiment illustrated in FIG. 4, the cathode region 402 includes the first n-doped layer 402a and an n$^{++}$-doped sinker 402b, whereas in the embodiment illustrated in FIG. 3, the cathode region 302 includes the first n-doped layer 302a, the second n$^+$-doped layer 302b and the third n$^{++}$-doped layer 302c, the third n$^{++}$-doped layer 302c being arranged in the second trench 314.

The n$^{++}$-doped sinker 402b may be formed by ion implantation of n-type impurities and/or diffusion of n-type impurities into the first n-doped layer 402. As an example, the n$^{++}$-doped sinker 402b may constitute part of a pn junction isolation in other parts of a semiconductor substrate. Hence, in semiconductor technologies including a pn junction isolation based on an n$^{++}$-doped sinker, the n$^{++}$-doped sinker 402b may be used as another functional element, i.e. as part of the cathode region 402 of the diode 400. This multifunctional use of the n$^{++}$-doped sinker 402b is beneficial with regard to a cost-benefit ratio of the underlying semiconductor technology. The same applies for semiconductor technologies having multifunctional use of second trenches 404a, 404b filled with conductive material such as the second p$^{++}$-doped semiconductor layer 406b.

A lateral breakdown voltage $V_{br,l}$ between the anode region 406 and the cathode region 402 may be adjusted by a lateral distance l$_1$, between the n$^{++}$-doped sinker 402b and each one of the first trenches 404a, 404b. As an example, when increasing (decreasing) l$_1$, the lateral breakdown voltage $V_{br,l}$ may be increased (decreased).

FIG. 5 is a schematic illustration of a vertical cross section through a part of a diode 500 according to an embodiment.

Similar to the diode 200a illustrated in FIG. 2A, the diode 500 includes a p-doped semiconductor substrate 501, a cathode region 502, a first n-doped layer 502a, a second n$^+$-doped layer 502b, a third n$^{++}$-doped layer 502c, an n$^+$-doped buried layer 503, a first trench 504, a first surface 505, an anode region 506, a first p$^+$-doped semiconductor layer 506a, a second p$^{++}$-doped semiconductor layer 506b, an anode contact 508 acting as a field plate, an insulating layer 509, a cathode contact 510, second trenches 514a, 514b and a lateral distance l$_1$ between each one of the second trenches 514a, 514b and the first trench 504.

The diode 500 differs from the diode 200a of FIG. 2A with regard to the arrangement of the first p$^+$-doped semiconductor layer. In the embodiment of the diode 200a illustrated in FIG. 2A, the first p$^+$-doped semiconductor layer 206a adjoins sidewalls and a bottom side of the first trench 204, whereas in the embodiment of the diode 500 illustrated in FIG. 5, a dielectric 516, e.g. an oxide or nitride, adjoins the first n-doped layer 502a at the bottom side of the first trench 504. Here, in electrical breakdown between the anode region 506 and the cathode region 502, current flow is limited to the sidewalls of the first trench 504, e.g. a lateral breakdown. The dielectric 516 may be beneficial in lowering electric field peaks around the bottom side of the first trench 504 which improves the current capability of the diode 500.

FIG. 6 is a schematic illustration of a vertical cross section through a part of a diode 600 according to an embodiment.

Similar to the diode 200a illustrated in FIG. 2A, the diode 600 includes a p-doped semiconductor substrate 601, a cathode region 602, a first n-doped layer 602a, a second n$^+$-doped layer 602b, a third n$^{++}$-doped layer 602c, an n$^+$-doped buried layer 603, a first trench 604, a first surface 605, an anode region 606, a first p$^+$-doped semiconductor layer 606a, a second p$^{++}$-doped semiconductor layer 606b, an anode contact 608, a cathode contact 610, second trenches 614a, 614b, a lateral distance $l_1$ between each one of the second trenches 614a, 614b and the first trench 604 and a vertical distance $l_2$ between a bottom side of the first trench 604 to a top side of the n$^+$-doped buried layer 603.

The diode 600 differs from the diode 200a of FIG. 2A with regard to the shape of the first and second trenches. In the embodiment of the diode 200a illustrated in FIG. 2A, the first and second trenches 204, 214a, 214b have vertical or slightly tapered sidewalls, whereas in the embodiment of the diode 600 illustrated in FIG. 6, a lateral width $w_{1b}$ in a bottom part of the first trench 604 is larger than a lateral width $w_{1t}$ in a top part of the first trench 604. Likewise, a lateral width $w_{2b}$ in a bottom part of each one of the second trenches 614a, 614b is larger than a lateral width $w_{2t}$ in a top part of each one of the second trenches 614a, 614b. Similar to the effect of a field plate, the reduction of the width of the first and second trenches 604, 614a, 614b may be beneficial in lowering electric field peaks around the top part of the first and second trenches 604, 614a, 614b, i.e. at the first surface 605, which improves the current capability of the diode 600.

In the embodiments illustrated above, the diodes include a p$^+$-doped semiconductor substrate. However, the conductivity type of the illustrated semiconductor regions may be reversed, i.e. an illustrated p-type region being n-type and an illustrated n-type region being p-type. Besides Si, the semiconductor substrate may also include or be made of Silicon on Insulator (SOI), GaAs, SiC.

Figure 7:
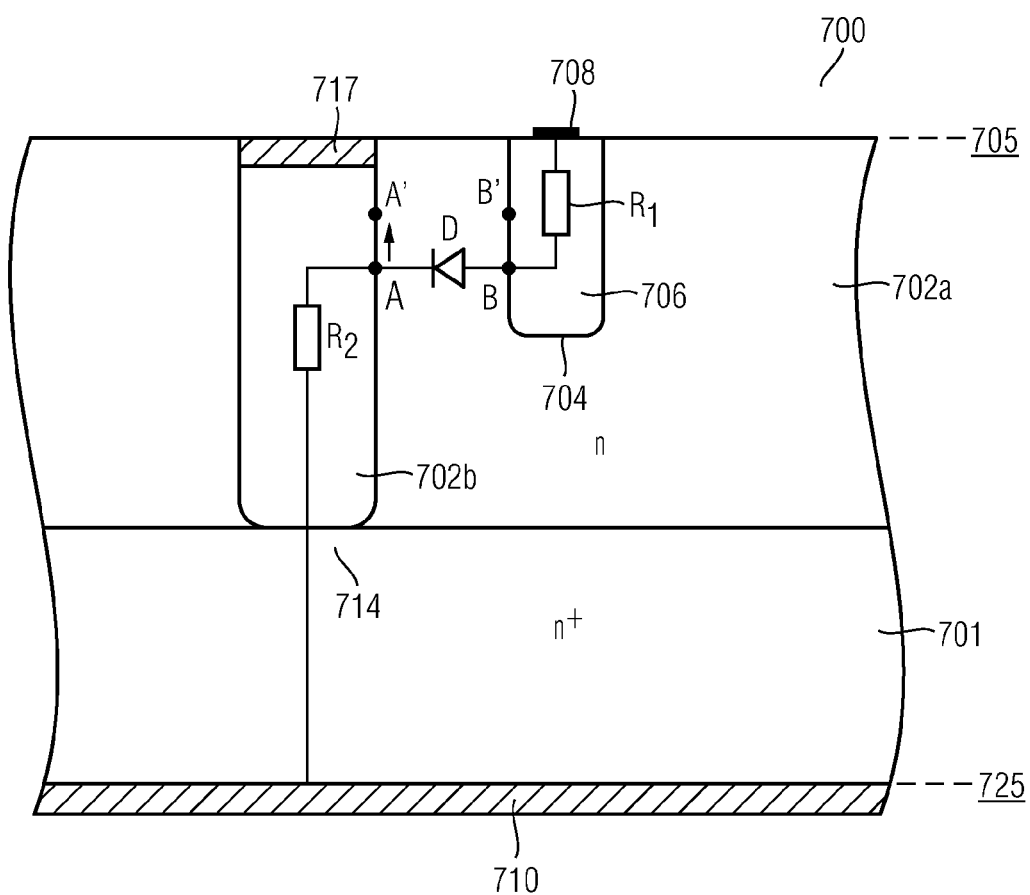
FIG. 7 is a schematic illustration of a vertical cross section through a part of a diode including an anode region in a first trench electrically coupled to an anode contact via a top side and a cathode region in a second trench electrically coupled to a cathode contact via a bottom side.

FIG. 7 is a schematic illustration of a vertical cross section through a part of a diode 700 according to an embodiment.

The diode 700 includes an n$^+$-doped semiconductor substrate 701, and a first n-doped layer 702a, e.g. an epitaxial layer, arranged on the n$^+$-doped substrate 701.

A first trench 704 extends into the first n-doped layer 702a from a first surface 705 and ends before a top side of the n$^+$-doped semiconductor substrate 701. A p-doped anode material 706 and/or a Schottky contact material, e.g. a metal or a silicide, is at least partly formed in the first trench 704. An anode contact 708 is electrically connected to the p-doped anode material 706 at the first surface 705.

A second trench 714 extends through the first n-doped layer 702a and ends at or within the n$^+$-doped semiconductor substrate 701. The second trench 714 includes a second cathode material 702b, e.g. n$^{++}$-doped polysilicon, and a dielectric 717 on the second cathode material 702b at the first surface 705. A cathode contact 710 is arranged at a second surface 725, e.g. at a rear side of the n$^+$-doped semiconductor substrate 701. The cathode contact 710 is electrically coupled to the second cathode material 702b via the n$^+$-doped semiconductor substrate 701 at a bottom side of the second trench 714.

The diode 700 may be beneficial with regard to uniform lateral current flow in a lateral breakdown mode between the p-doped anode material 706 and the n-doped first layer 702a. This is illustrated by way of a simplified current path between the anode contact 708 and the cathode contact 710 which includes a first resistor $R_1$ in the first trench 704, a diode D and a second resistor $R_2$ in the second trench 714. A resistance value of the resistor $R_2$ increases when current flows in a lateral direction from A' to B' instead of from A to B. Since a resistance value of the resistor $R_1$ at the same time decreases when current flows in a lateral direction from A' to B' instead of from A to B, a compensation of an overall path resistor including $R_1 + R_2$ occurs. In one embodiment, the shape of the trenches 704, 714 and the conductivity of the materials filled therein is appropriately chosen so that the increase in the resistance value of $R_1$ equals or is almost equal to the decrease in the resistance value of $R_2$.

Figure 8:
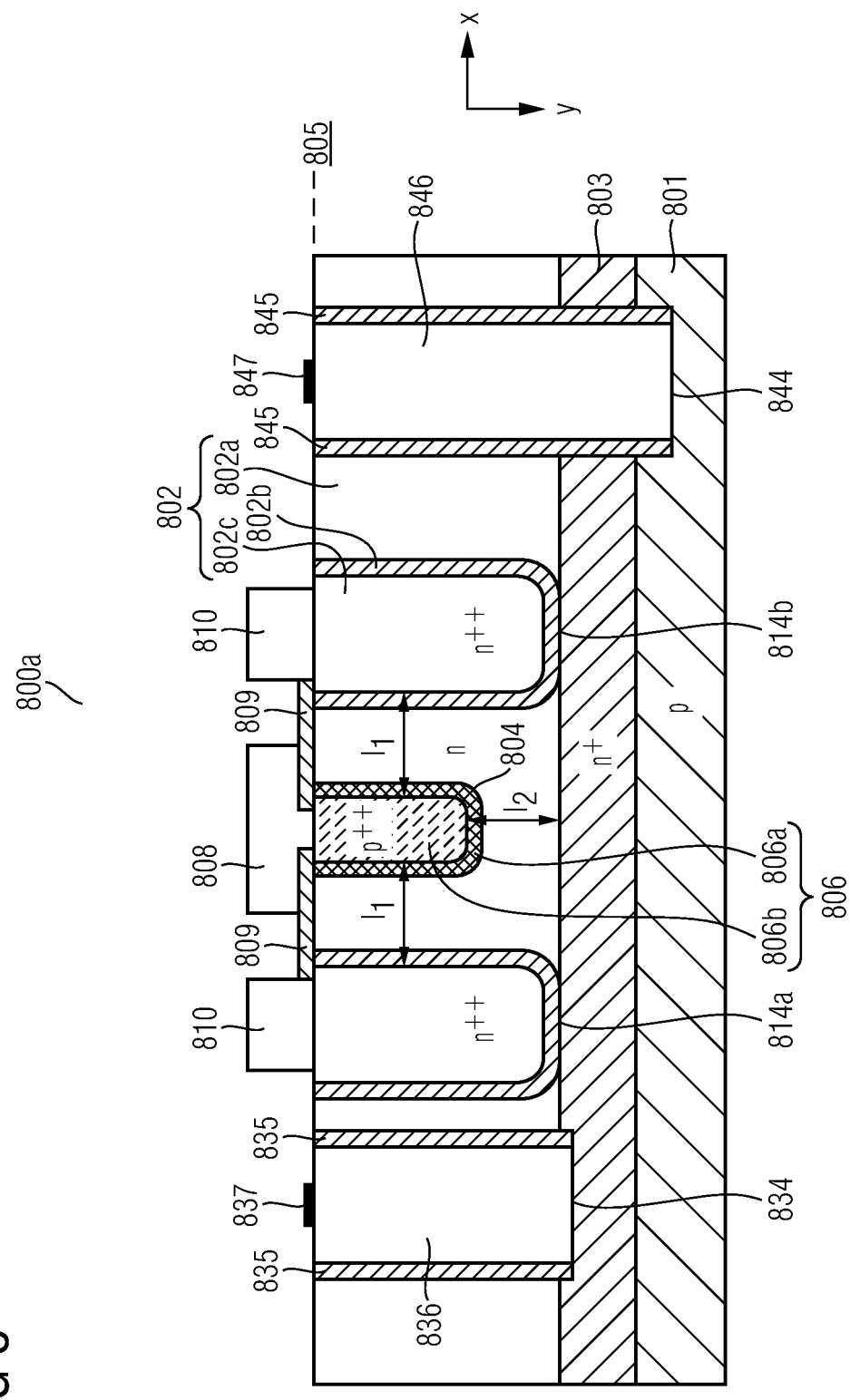
FIGS. 8 to 10 are schematic illustrations of vertical cross sections through a part of a semiconductor diode including anode and cathode regions in first and second trenches and devices isolations according to different embodiments.
Figure 9:
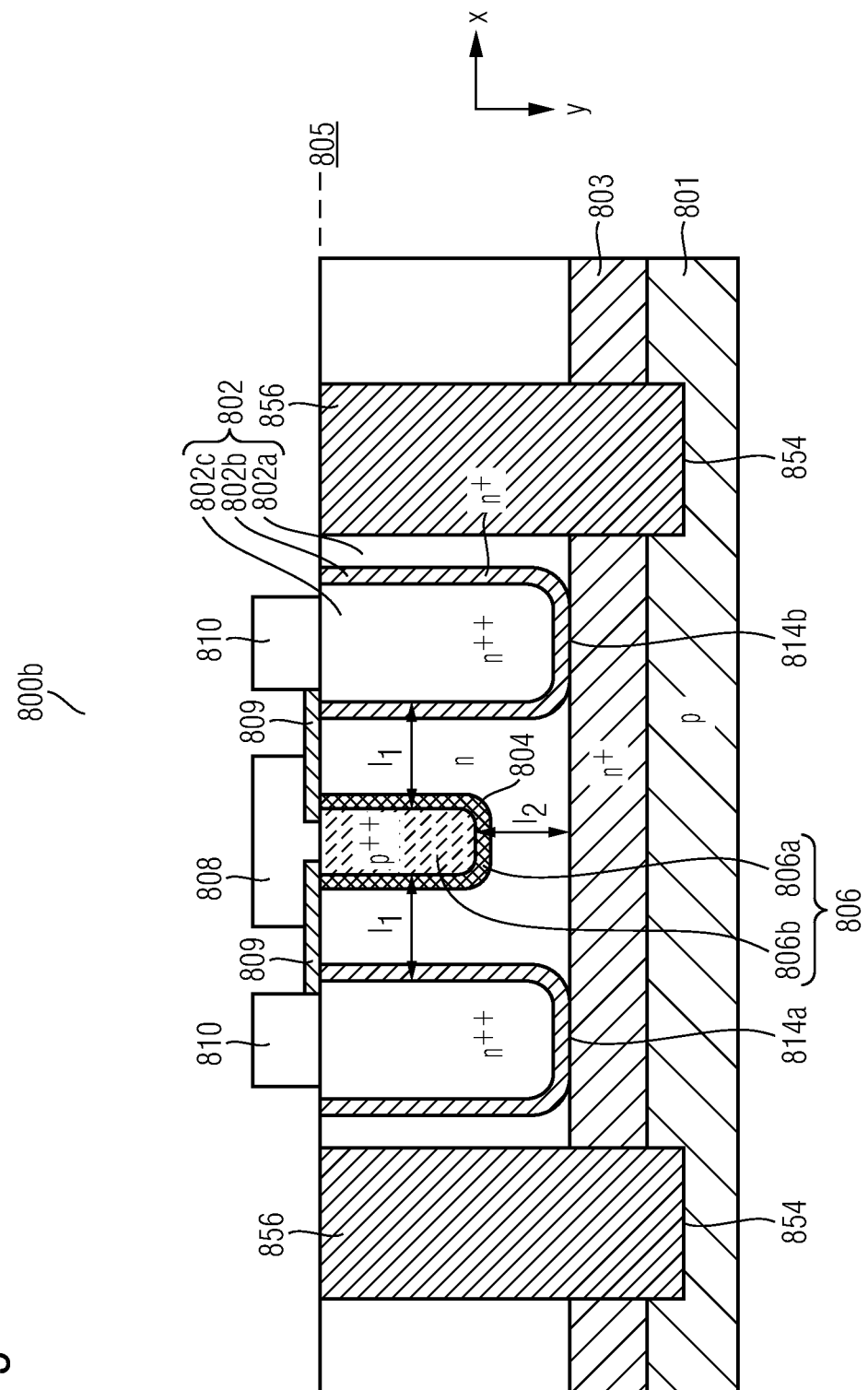
Figure 10:
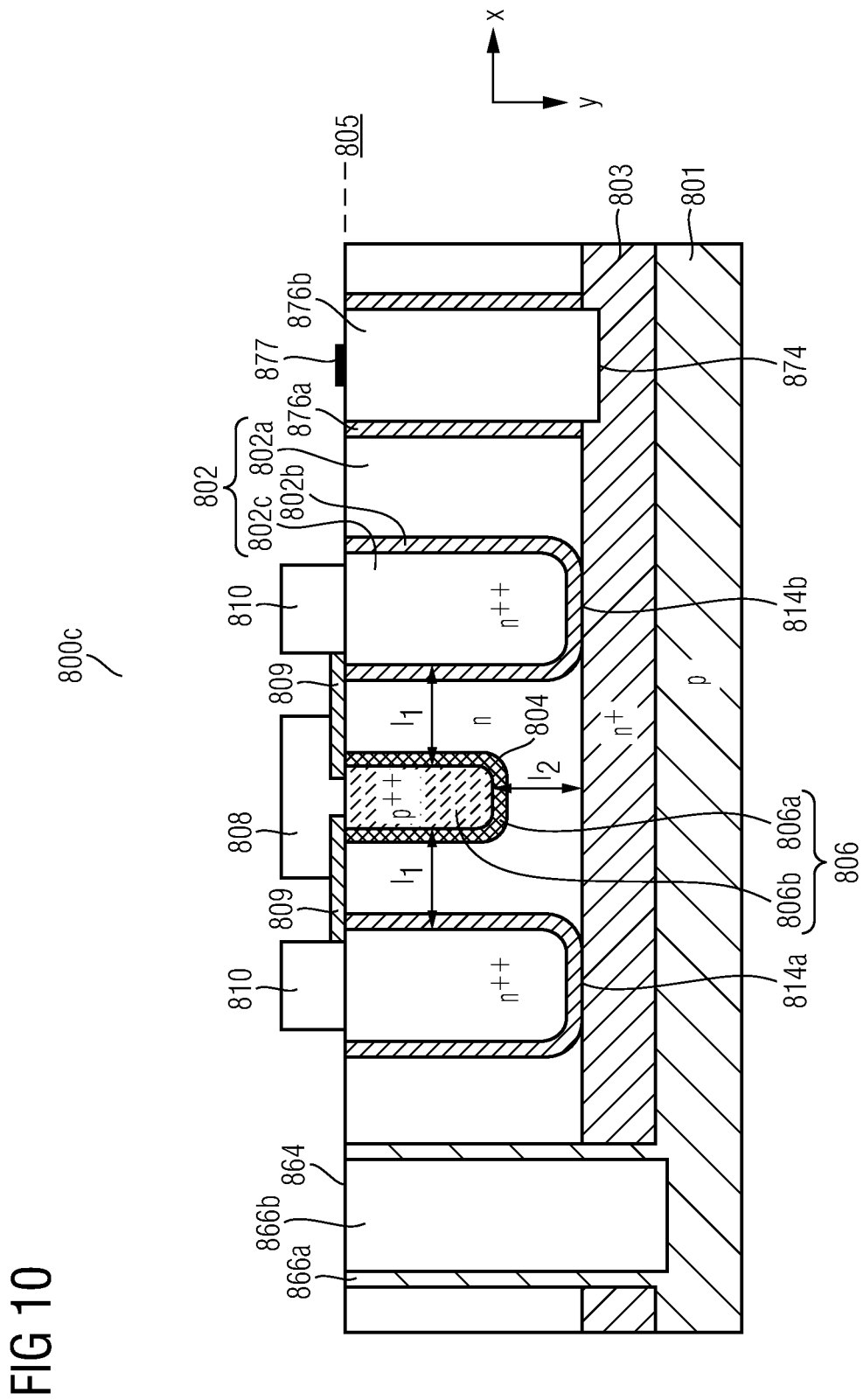

FIGS. 8 to 10 are schematic illustrations of vertical cross sections through a part of semiconductor diodes 800a, 800b, 800c including additional trenches for interconnection and/or isolation.

Similar to the diode 200a illustrated in FIG. 2A, each one of the diodes 800a, 800b, 800c includes a p-doped semiconductor substrate 801, a cathode region 802, a first n-doped layer 802a, a second n$^+$-doped layer 802b, a third n$^{++}$-doped layer 802c, an n$^+$-doped buried layer 803, a first trench 804, a first surface 805, an anode region 806, a first p$^+$-doped semiconductor layer 806a, a second p$^{++}$-doped semiconductor layer 806b, an anode contact 808 acting as a field plate, an insulating layer 809, a cathode contact 810, second trenches 814a, 814b, a lateral distance $l_1$ between each one of the second trenches 814a, 814b and the first trench 814 and a vertical distance $l_2$ between a bottom side of the first trench 804 to a top side of the n$^+$-doped buried layer 803.

In the diode 800a illustrated in FIG. 8, a third trench 834 extends from the first surface 805 through the first n-doped layer 802a into the n$^+$-doped buried layer 803. At sidewalls of the third trench 834 a sidewall dielectric 835 is formed. The third trench 834 is filled with a conductive material 836, e.g. an n$^{++}$-doped semiconductor material such as n$^{++}$-doped polysilicon and/or a metal, electrically coupling the n$^+$-doped buried layer 803 to a contact 837 at the first surface 805.

A fourth trench 844 extends from the first surface 805 through the first n-doped layer 802a, through the n$^+$-doped buried layer 803 and into the p-doped semiconductor substrate 801. At sidewalls of the fourth trench 844 a sidewall dielectric 845 is formed. The fourth trench 844 is filled with a conductive material 846, e.g. an p$^{++}$-doped semiconductor material such as p$^{++}$-doped polysilicon and/or a metal, electrically coupling the p-doped semiconductor substrate 801 to a contact 847 at the first surface 805.

In the diode 800b illustrated in FIG. 9, a fifth trench 854 extends from the first surface 805 through the first n-doped layer 802a, through the n$^+$-doped buried layer 803 and into the p-doped semiconductor substrate 801. The fifth trench 854 is filled with a dielectric material 856, e.g. an oxide and/or a nitride, electrically isolating the diode 800b from surrounding semiconductor elements.

In the diode 800c illustrated in FIG. 10, a sixth trench 864 extends from the first surface 805 through the first n-doped layer 802a, through the n$^+$-doped buried layer 803 and into the p-doped semiconductor substrate 801. A p-doped semiconductor layer 866a adjoins sidewalls of the sixth trench 864. The sixth trench 864 is filled with a p$^{++}$-doped semiconductor layer 866b, e.g. p$^{++}$-doped polysilicon. The p$^+$-doped semiconductor layer 866a and the p$^{++}$-doped semiconductor layer 866b together with a surrounding part of the first n-doped layer 802a constitute a pn junction isolation for electrically isolating the diode 800c from surrounding semiconductor elements.

A seventh trench 874 extends from the first surface 805 through the first n-doped layer 802a into the n$^+$-doped buried layer 803. An n$^+$-doped semiconductor layer 876a adjoins sidewalls of the seventh trench 874. The seventh trench 874 is filled with an n$^{++}$-doped semiconductor layer 876b, e.g. n$^{++}$-doped polysilicon. The n$^+$-doped semiconductor layer 876a and the n++-doped semiconductor layer 876b electrically couple the n+-doped buried layer 803 to a contact 877 at the first surface 805.

In the diodes illustrated in FIGS. 8 to 10, a lateral distance between any one of the third, fourth, fifth and sixth trenches and any neighbouring one of the first and second trenches may be in a range of 0 nm to 20 μm, in particular 0 nm to 3 μm or 0 nm to 200 nm.

Figure 11:
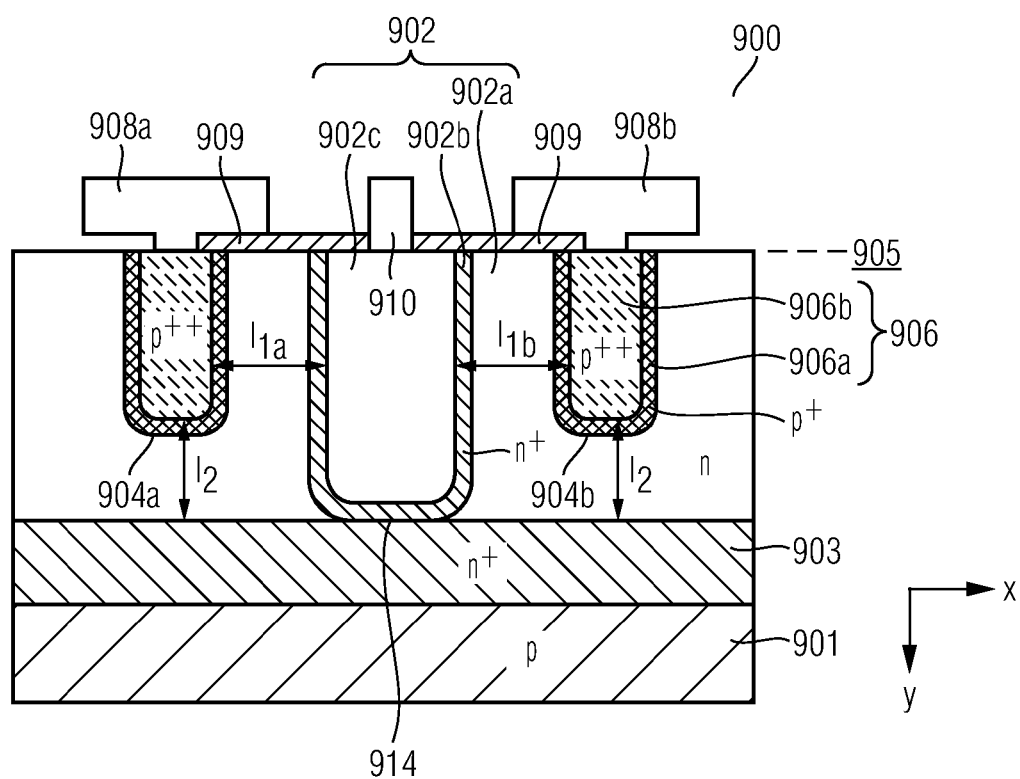
FIG. 11 is a schematic illustration of a vertical cross section through a part of a semiconductor diode including first and second anode regions that are electrically disconnected and arranged in separate trenches.

FIG. 11 is a schematic illustration of a vertical cross section through a part of a diode 900 according to an embodiment.

Similar to the diode 300 illustrated in FIG. 3, the diode 900 includes a p-doped semiconductor substrate 901, a cathode region 902, a first n-doped layer 902a, a second n+-doped layer 902b, a third n++-doped layer 902c, an n+-doped buried layer 903, first trenches 904a, 904b, a first surface 905, an anode region 906, a first p+-doped semiconductor layer 906a, a second p++-doped semiconductor layer 906b, an insulating layer 909, a cathode contact 910, a second trench 914 and a vertical distance $l_2$ between a bottom side of each one of the first trenches 904a, 904b to a top side of the n+-doped buried layer 903.

The diode 900 differs from the diode 300 of FIG. 3 in that the diode 900 includes a first anode contact 908a and a second anode contact 908b that are electrically disconnected. The diode 900 includes two diodes connected in series with their cathodes connected together.

A lateral breakdown voltage of the first diode including the first anode contact 908a may be set by adjusting a lateral distance $l_{1a}$ between the first trench 904a and the second trench 914. A lateral breakdown voltage of the second diode including the second anode contact 908b may be set by adjusting a lateral distance $l_{1b}$ between the first trench 904b and the second trench 914. As an example, the first anode contact 908a is electrically connected to a first pin and the second anode contact 908b is electrically connected to a second pin different from the first pin.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body including a first trench region extending into the semiconductor body from a first surface of the semiconductor body;
   an ESD (electrostatic static discharge) protection diode including an anode region and a cathode region; and wherein
   one of the anode region and the cathode region is at least partly arranged in the first trench region, and
   the other one of the anode region and the cathode region includes a first semiconductor region adjoining the one of the anode region and the cathode region from outside of the first trench region,
   the semiconductor device further comprising a field plate arranged on the first surface, the field plate overlapping a pn-junction comprising a p-doped region of the anode region abutting an n-doped region of the cathode region at the first surface,
   a contact located at the first surface and electrically connected to the one of the anode region and the cathode region at the first surface, and
   wherein the field plate and the contact are electrically connected.

2. The semiconductor device of claim 1, wherein a direction of electrical breakdown current between the anode region and the cathode region is a lateral direction parallel to the first surface.

3. The semiconductor device of claim 1, wherein the ESD protection diode includes a positive differential resistance of less than 20 mΩ×mm² at a breakdown voltage $V_{br}$>20V and at a temperature T=423K for a whole breakdown current range of 0.1 to 10 A/mm².

4. The semiconductor device of claim 1, wherein at least one of the anode region and the cathode region is electrically connected with a pin.

5. The semiconductor device of claim 1, wherein:
   the first semiconductor region is of a first conductivity type; and
   the one of the anode region and the cathode region includes a second semiconductor region of a second conductivity type opposite the first conductivity type.

6. The semiconductor device of claim 5, wherein the second semiconductor region includes doped polysilicon.

7. The semiconductor device of claim 5, wherein the first trench region is filled with the second semiconductor region.

8. The semiconductor device of claim 5, wherein a first part of the second semiconductor region, at least one of a dielectric and a metal structure and a second part of the second semiconductor region are arranged in this order along a lateral direction parallel to the first surface.

9. The semiconductor device of claim 1, further comprising:
   a contact area to the one of the anode region and the cathode region arranged on the first surface; and
   a contact area to the other one of the anode region and the cathode region arranged on a second surface of the semiconductor body opposite the first surface.

10. The semiconductor device of claim 9, wherein:
    the contact area to the one of the anode region and the cathode region is electrically coupled to the one of the anode region and the cathode region at a top side of the one of the anode region and the cathode region; and
    the contact area to the other one of the anode region and the cathode region is electrically coupled to the other one of the anode region and the cathode region at a bottom side of the other one of the anode region and the cathode region.

11. The semiconductor device of claim 1, further comprising:
    a contact area to the one of the anode region and the cathode region arranged on the first surface; and
    a contact area to the other one of the anode region and the cathode region arranged on the first surface.

12. The semiconductor device of claim 1, further comprising:
    a second trench region extending into the semiconductor body from the first surface; and wherein
    the other one of the anode region and the cathode region is arranged at least partly in the second trench region.

13. The semiconductor device of claim 12, wherein a first depth of the first trench region differs from a second depth of the second trench region.

14. The semiconductor device of claim 12, wherein the second trench region is surrounding the first trench region at the first surface.

15. The semiconductor device of claim 12, wherein the first and second trench regions are arranged parallel to each other along the first surface.

16. The semiconductor device of claim 1, wherein the one of the anode region and the cathode region is a first electrode region arranged in the first trench region, the semiconductor device further comprising a second electrode region arranged in a second trench region.

17. The semiconductor device of claim 16, wherein:
the first electrode region is electrically connected to a first pin; and
the second electrode region is electrically connected to a second pin different from the first pin.

18. The semiconductor device of claim 1, further comprising:
a buried layer adjoining a bottom side of the first semiconductor region, the buried layer including a concentration of dopants that is larger than a concentration of dopants of the first semiconductor region; and wherein
a conductivity type of the buried layer and the first semiconductor region is the same.

19. The semiconductor device of claim 1, wherein the ESD protection diode is a Schottky diode and the one of the anode region and the cathode region is a Schottky contact material arranged in the first trench region.

20. The semiconductor device of claim 1, further comprising a shallow trench isolation at the first surface in an area of the first semiconductor region.

21. The semiconductor device of claim 1, wherein a lateral width of the first trench region is larger in a bottom part of the first trench region than in a top part of the first trench region.

22. The semiconductor device of claim 12, further comprising:
a plurality of the first trenches and a plurality of the second trenches; and wherein
a lateral distance between one of the first trenches and a neighboring one of the second trenches differs from a lateral distance between another one of the first trenches and another neighboring one of the second trenches.

23. The semiconductor device of claim 1, further comprising an isolating layer at a bottom side of the first trench.

24. The semiconductor device of claim 1, further comprising:
a semiconductor substrate;
a p-doped semiconductor layer on the semiconductor substrate; and wherein
the first semiconductor region is arranged in the p-doped semiconductor layer.

25. The semiconductor device of claim 1, further comprising a functional element, and wherein the ESD protection diode covers an area at the first surface in a range between 1000 $\mu m^2$ and 1 $mm^2$ and configured to protect the functional element against ESD.

26. The semiconductor device of claim 1, further comprising a semiconductor element, and wherein the ESD protection diode is a clamping diode configured to clamp a voltage between two terminals of the semiconductor element.

27. A semiconductor device, comprising:
a semiconductor body including a first trench extending into the semiconductor body from a first surface of the semiconductor body;
an ESD (electrostatic static discharge) protection diode including an anode region and a cathode region; and wherein
one of the anode region and the cathode region is at least partly arranged in the first trench,
the other one of the anode region and the cathode region includes a first semiconductor region directly adjoining the one of the anode region and the cathode region from outside of the first trench, thereby constituting a pn-junction in the semiconductor body and extending to the first surface,
the semiconductor device further comprises a second trench at a lateral distance to the first trench and extending into the semiconductor body from the first surface, and
the other one of the anode region and the cathode region is arranged at least partly in the second trench, and
further comprising a conducting path of the ESD diode through a sidewall of the first trench and wherein the pn-junction extends along at least 50% of a depth of the first trench.

28. The semiconductor device of claim 1, wherein an insulating layer is arranged between and abuts the pn-junction at the first surface and the field plate.

29. The semiconductor device of claim 1, wherein the first semiconductor region extends parallel to a sidewall of the first trench region, thereby constituting the pn-junction.

* * * * *